(12) United States Patent
Ichinomiya

(10) Patent No.: US 7,579,864 B2
(45) Date of Patent: Aug. 25, 2009

(54) LOGIC BLOCK CONTROL SYSTEM AND LOGIC BLOCK CONTROL METHOD

(75) Inventor: Takahiro Ichinomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/093,263

(22) PCT Filed: Nov. 15, 2006

(86) PCT No.: PCT/JP2006/322760

§ 371 (c)(1),
(2), (4) Date: May 9, 2008

(87) PCT Pub. No.: WO2007/060868

PCT Pub. Date: May 31, 2007

(65) Prior Publication Data

US 2009/0115452 A1     May 7, 2009

(30) Foreign Application Priority Data

Nov. 25, 2005    (JP)    ........................... 2005-339945

(51) Int. Cl.
*H03K 19/173* (2006.01)
(52) U.S. Cl. ........................................... 326/38; 326/41
(58) Field of Classification Search ............... 326/37–41, 326/93
See application file for complete search history.

(56) References Cited

U.S. PATENT DOCUMENTS

| 5,297,103 | A | 3/1994 | Higuchi |
| 6,425,068 | B1 | 7/2002 | Vorbach et al. |
| 6,501,300 | B2* | 12/2002 | Hatae .......................... 326/93 |
| 7,492,186 | B2* | 2/2009 | Hutchings et al. ............. 326/39 |
| 2003/0056085 | A1 | 3/2003 | Vorbach et al. |
| 2003/0107400 | A1* | 6/2003 | Kumamoto .................. 326/38 |
| 2004/0168099 | A1 | 8/2004 | Vorbach et al. |

FOREIGN PATENT DOCUMENTS

| JP | 5-198198 | 8/1993 |
| JP | 2000-91435 | 3/2000 |
| JP | 2001-505382 | 4/2001 |
| JP | 2003-174358 | 6/2003 |

OTHER PUBLICATIONS

International Search Report issued Dec. 12, 2006 in the International (PCT) Application of which the present application is the U.S. National Stage.

* cited by examiner

*Primary Examiner*—Don P Le
(74) *Attorney, Agent, or Firm*—Wenderoth, Lind & Ponack, L.L.P.

(57) ABSTRACT

The number of blocks that can be stopped when performing target processing in a programmable logic unit is obtained, and a stop rate of each of a plurality of logic blocks included in the programmable logic unit is calculated. The same number of logic blocks as the blocks that can be stopped are selected from among the plurality of logic blocks in ascending order of a stop rate, the selected logic blocks are determined as logic blocks whose operations are to be stopped, and the operations are stopped. As a technique of stopping an operation of a logic block, a gated clock technique, a power-off technique, or the like is used.

8 Claims, 12 Drawing Sheets

| BLOCK | OPERATION CLOCK NUMBER |
|---|---|
| WHOLE | 10000 |
| LOGIC BLOCK a | 8000 |
| LOGIC BLOCK b | 9000 |
| LOGIC BLOCK c | 8000 |
| LOGIC BLOCK d | 9000 |

FIG. 6A
FOUR LOGIC BLOCKS ARE REQUIRED FOR LOGIC OPERATION PROCESSING
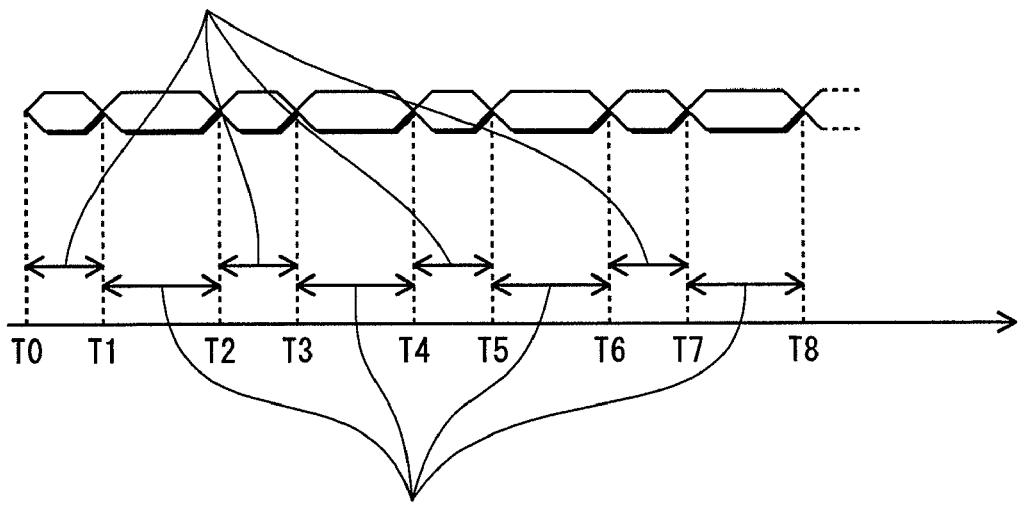
ONE LOGIC BLOCK IS REQUIRED FOR LOGIC OPERATION PROCESSING
FIG. 6B
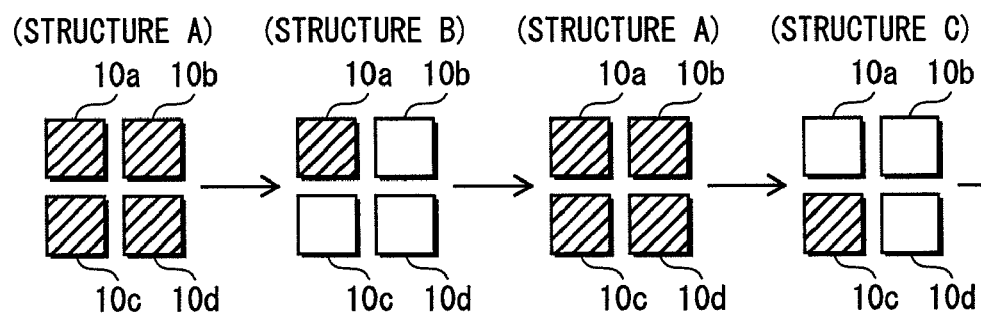
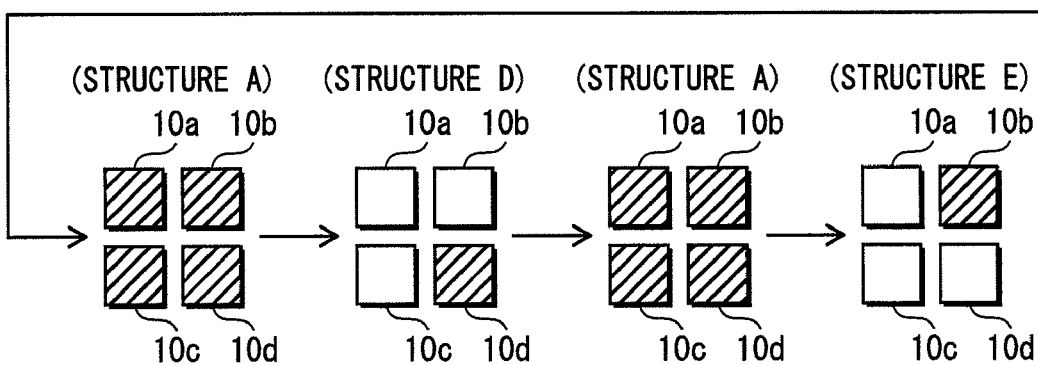

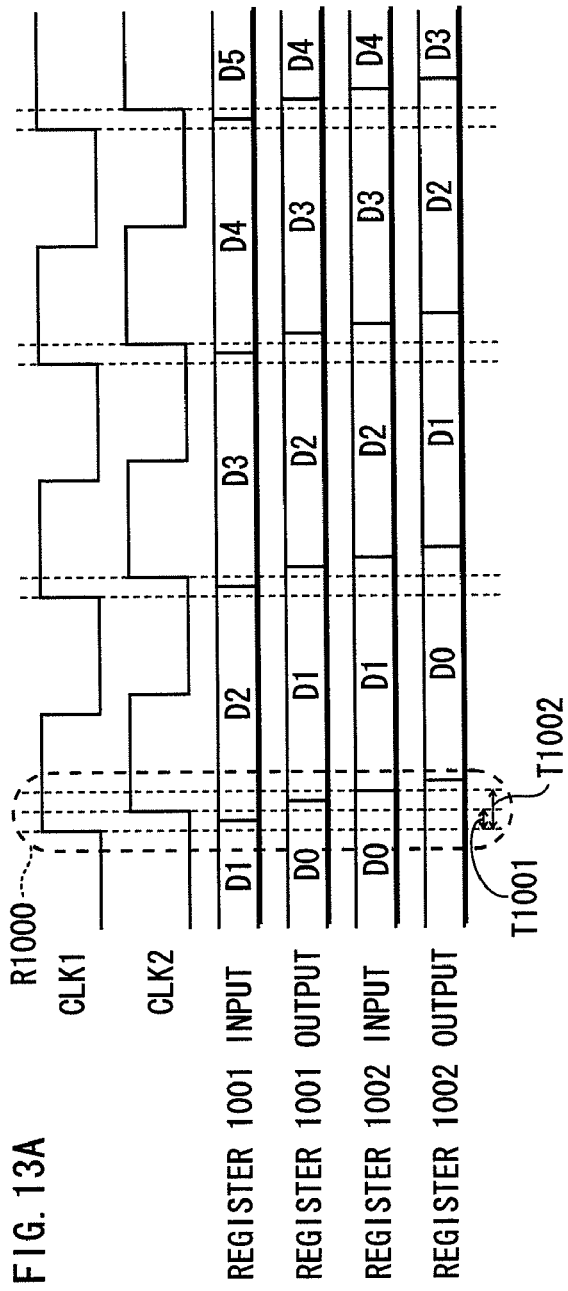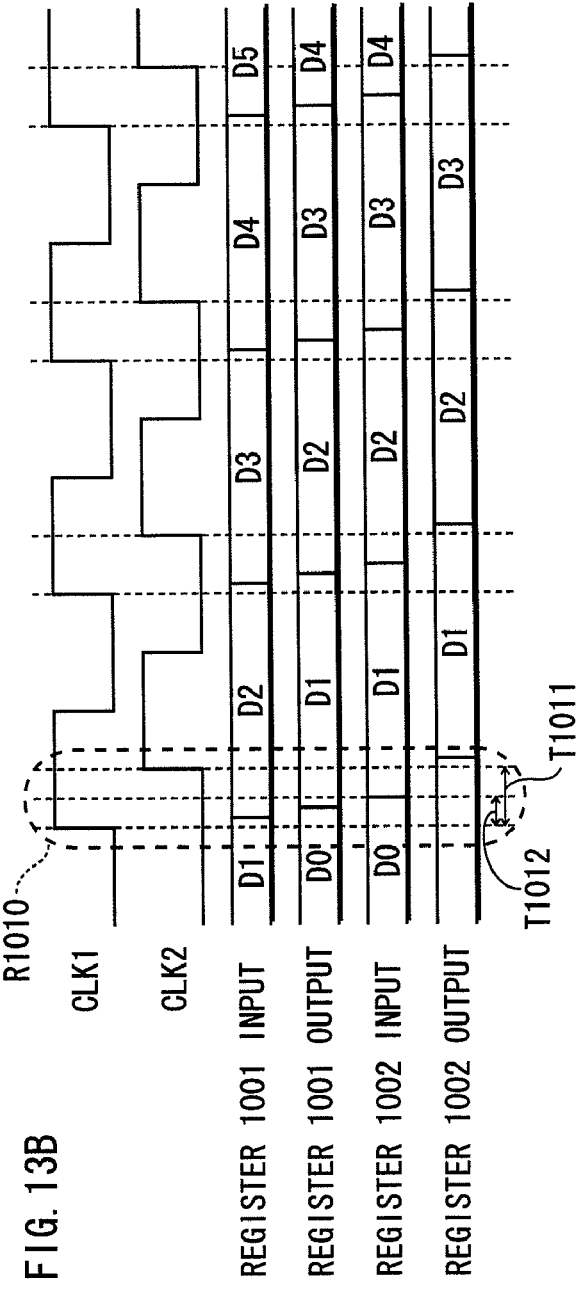

US 7,579,864 B2

LOGIC BLOCK CONTROL SYSTEM AND LOGIC BLOCK CONTROL METHOD

TECHNICAL FIELD

The present invention relates to a programmable logic circuit whose function can be changed by a program, such as a FPGA (Field Programmable Gate Array) or reconfigurable logic.

BACKGROUND ART

A programmable logic circuit such as a FPGA or reconfigurable logic is known as a device that can perform different circuit operations by having a plurality of logic blocks that perform logic operation processing and changing a connection state between the plurality of logic blocks programmable.

Meanwhile, a gated clock technique of stopping a clock supply to a flip-flop (hereinafter, referred to as FF) or the like that does not need to operate is known as a technique for reducing power consumption in a circuit that is used in a system such as a mobile terminal. Another known technique for reducing power consumption in a circuit is a technique (hereinafter, referred to as power-off technique) of reducing a leak current by setting a switch arranged between a power supply and a module OFF according to need.

By applying the gated clock technique and the power-off technique for reducing power consumption to a programmable logic circuit, a low-power consumption programmable logic circuit can be realized (refer to a patent document 1, for example). When realizing the low-power consumption programmable logic circuit, clock skew poses a problem.

Here, the clock skew will be described.

In a synchronous design method that is currently often used in LSI (Large Scale Integration) design, a clock signal for controls is applied, for example, to registers with a same timing. In actual LSI, a difference of a delay, which is caused in a clock signal between a clock generation source and a register (hereinafter, referred to as clock delay), may occur between registers because of a structure difference of a clock supply circuit. This delay difference is called clock skew. If clock skew having a predetermined period of time or longer occurs, an error is caused in transfer of data between registers, resulting in an operational defect in the programmable logic circuit.

The following describes an operational defect in a programmable logic circuit caused by clock skew, with reference to FIGS. 12, 13A and 13B. FIGS. 12, 13A and 13B illustrate a situation where the operational defect in the programmable logic circuit is caused by the clock skew. Note that FIG. 13A shows a case in which transfer of data is correctly performed between a register 1001 and a register 1002, and FIG. 13B shows a case in which transfer of data is not correctly performed between the register 1001 and the register 1002.

In a circuit example shown in FIG. 12, output data from the register 1001 is inputted to the register 1002 as input data. A clock signal CLK1 and a clock signal CLK2 are inputted to the register 1001 and the register 1002 respectively.

A time from when the clock signal CLK1 rises to when the clock signal CLK2 rises (a delay difference between the clock signal CLK1 and the clock signal CLK2) is each of T1001 and T1011. Also, a time from when the clock signal CLK1 rises to when an input to the register 1002 varies is each of T1002 and T1012.

In the case of FIG. 13A in which the time T1001 is shorter than the time T1002, the clock signal CLK2 rises before the input to the register 1002 varies as shown in a section R1000. Therefore, data that is retrieved by the register 1002 at the rising edge of the clock signal CLK2 is data that was outputted from the register 1001 before the clock signal CLK1 rises, i.e., data which is to be retrieved by the register 1002 if transfer of data is correctly performed between the registers.

In the case of FIG. 13B in which the time T1011 is longer than the time T1012, the clock signal CLK2 rises after the input to the register 1002 has varied as shown in a section R1010. Therefore, data that is retrieved by the register 1002 at the rising edge of the clock signal CLK2 is data that was retrieved by the register 1001 at the rising edge of the clock signal CLK1. Thus, transfer of data is not correctly performed between the register 1001 and the register 1002.

As mentioned above, if clock skew having a predetermined period of time or longer occurs, an error is caused in transfer of data between registers. Therefore, a delay element for compensating for clock skew is generally inserted between registers to avoid the error caused in transfer of data between registers due to the clock skew.

Patent Document 1: Japanese Published Patent Application No. 2003-174358

DISCLOSURE OF THE INVENTION

Problems the Invention is Going to Solve

A programmable logic circuit includes a transistor. It is known that especially a P-channel MOS transistor (hereinafter, referred to as PMOS transistor) is degraded with time by NBTI (Negative Bias Temperature Instability), HCI (Hot Carrier Injection), and the like. For example, the NBTI is the following phenomenon. When the PMOS transistor is ON under a high temperature condition, hydrogen existing at an interface between a gate insulation film and a silicon substrate is dissociated and a fixed charge is formed. This raises a threshold voltage and decreases a current capacity of the PMOS transistor.

The degradation with time of a transistor causes clock skew. The following describes this problem, with reference to FIGS. 14 and 15. FIGS. 14 and 15 illustrate a situation where clock skew occurs due to degradation with time of a transistor.

A clock signal CLK has a duty ratio of 50%, and is inputted to gate circuits 2010 and 2020.

For example, suppose an enable signal EN1 supplied to the gate circuit 2010 is HIGH and an enable signal EN2 supplied to the gate circuit 2020 is LOW, for a predetermined time from an initial state.

When the enable signal EN1 is HIGH, a clock signal is outputted from the gate circuit 2010. As a result, a PMOS transistor P2011 and a PMOS transistor P2012 are ON for a substantially equivalent time period, the PMOS transistor P2011 and the PMOS transistor P2012 have a substantially equivalent effect of NBTI, and a substantially equivalent current capacity decreases with regard to the PMOS transistor P2011 and the PMOS transistor P2012.

When the enable signal EN2 is LOW, a LOW signal is continuously outputted from the gate circuit 2020. As a result, a PMOS transistor P2021 is continuously ON, continuously has an effect of NBTI, and a current capacity of the PMOS transistor P2021 remarkably decreases. On the other hand, a PMOS transistor P2022 is continuously OFF, has no effect of NBTI, and a current capacity of the PMOS transistor P2022 does not decrease.

It is assumed here that a current capacity does not decrease in N-channel MOS transistors (hereinafter, referred to as NMOS transistor) N2011, N2012, N2021, and N2022.

Suppose both of the enable signals EN1 and EN2 are HIGH after the above predetermined time has passed, as shown in FIG. 15.

Signals at nodes N1 and N4 rise when a predetermined time has passed from a rising edge E2010 of the clock signal CLK. Signals at nodes N2 and N5 fall when a predetermined time has passed after the signals at the nodes N1 and N4 have risen. Signals at nodes N3 and N6 rise when times T2012 and T2022 have passed respectively after the signals at the nodes N2 and N5 have fallen. A decrease of a current capacity of the PMOS transistor P2012 is larger than a decrease of a current capacity of the PMOS transistor P2022. Therefore, as shown in FIG. 15, the time T2012 is longer than the time T2022.

The signals at the nodes N1 and N4 fall when a predetermined time has passed from a falling edge E2020 of the clock signal CLK. The signals at the nodes N2 and N5 rise when times T2011 and T2021 have passed respectively after the signals at the nodes N1 and N4 have fallen. The signals at the nodes N3 and N6 fall when a predetermined time has passed after the signals at the nodes N2 and N5 have risen. A decrease of a current capacity of the PMOS transistor P2011 is smaller than a decrease of a current capacity of the PMOS transistor P2021. Therefore, as shown in FIG. 15, the time T2011 is shorter than the time T2021.

As mentioned above, clock skew occurs due to degradation with time of a transistor, and causes an error in transfer of data between registers. Therefore, it is required to consider clock skew due to degradation with time of a transistor in design of LSI.

As shown in FIG. 15, in various circuits including elements that are degraded with time such as a PMOS transistor, operation times of elements are different. This results in a difference of a delay amount of an output to an input in the various circuits.

However, the technique in the patent document 1 does not consider clock skew due to degradation with time of a transistor. Therefore, there is a possibility that the programmable logic circuit wrongly operates because of the clock skew due to the degradation with time of the transistor.

In view of this, an object of the present invention is to provide a logic block control system and a logic block control method that can prevent a wrong operation in transfer of data between logic blocks, from occurring because of clock skew or the like due to degradation with time of an element in a logic block.

Means of Solving the Problems

The above-mentioned object can be achieved by a logic block control system comprising: a programmable logic unit that includes a plurality of logic blocks for performing logic operation processing, and is capable of programmably changing a setting of a connection state between the plurality of logic blocks; a determination unit operable to determine, from among the plurality of logic blocks, logic blocks whose operations are to be stopped, based on a stop time of each of the plurality of logic blocks, a number of the determined logic blocks being equal to a number of logic blocks whose operations are stoppable when the programmable logic unit performs target processing; and a control unit operable to stop the operations of the logic blocks determined by the determination unit, and change the setting of the connection state between the plurality of logic blocks to enable the target processing.

A logic block control method of the present invention is a logic block control method of controlling an operation of each of a plurality of logic blocks for performing logic operation processing included in a programmable logic unit that is capable of programmably changing a setting of a connection state between the plurality of logic blocks, comprising: a determination step of determining, from among the plurality of logic blocks, logic blocks whose operations are to be stopped, based on a stop time of each of the plurality of logic blocks, a number of the determined logic blocks being equal to a number of logic blocks whose operations are stoppable when the programmable logic unit performs target processing; and a control step of stopping the operations of the logic blocks determined by the determination step, and changing the setting of the connection state between the plurality of logic blocks to enable the target processing.

Effects of the Invention

With the above-stated construction of each of the logic block control system and the logic block control method, because a logic block whose operation is to be stopped is determined based on a stop time of each of logic blocks, an operation amount of a logic block can be equalized between the logic blocks. Therefore, a degradation level can be equalized between the logic blocks, and an error in transfer of data between the logic blocks, which is due to clock skew or the like caused by degradation with time of an element in a logic block, can be prevented.

In the above logic block control system, the determination unit determines all of the plurality of logic blocks as logic blocks to operate without determining the logic blocks whose operations are to be stopped, until an operation time, in which the programmable logic unit is performing processing, exceeds a predetermined start time, and starts determining the logic blocks whose operations are to be stopped when the operation time exceeds the predetermined start time.

For example, it is known that a P-channel MOS transistor is sharply degraded when an ON-time is short, and the degradation is not progressed so much as the ON-time becomes longer. Therefore, when the ON-time is short, there is a possibility that degradation levels between logic blocks vary greatly even when stop times between logic blocks vary slightly.

With the above-stated construction of the logic block control system, when an ON-time of, for example, a P-channel MOS transistor in a logic block is short, all of logic blocks are operated to degrade P-channel MOS transistors in all of the logic blocks. Therefore, even when the ON-time is short in which the P-channel MOS transistor is sharply degraded, for example, a difference of degradation levels between logic blocks can be prevented from being large, and transfer of data between the logic blocks can be correctly performed.

The above logic block control system further comprises: a detection unit operable to detect, from among the logic blocks whose operations are stopped by the control unit, a logic block whose value based on a stop time thereof is out of at least a predetermined range for a value based on a stop time of each of all logic blocks which are operating, wherein the control unit has the logic block detected by the detection unit operate.

With the above-stated construction, a difference of degradation levels between logic blocks can be constantly in a predetermined range, and transfer of data between the logic blocks can be correctly performed.

The logic block control system further comprises: a clock gate unit operable to, for each of the plurality of logic blocks, pass a clock signal when a control signal is in a first logic state, and interrupt the clock signal when the control signal is in a second logic state, wherein the control unit stops the operations of the logic blocks determined by the determination unit, by setting the control signal supplied to the clock gate unit corresponding to each of the determined logic blocks to the second logic state.

With the above-stated construction, because a gated clock technique that is a known technique is used for stop control of a logic block, a load for developing the stop control of the logic block can be reduced.

The logic block control system further comprises: a power-off unit operable to, for each of the plurality of logic blocks, electrically connect the logic block to a power supply when a control signal is in a first logic state, and electrically interrupt the logic block from the power supply when the control signal is in a second logic state, wherein the control unit stops the operations of the logic blocks determined by the determination unit, by setting the control signal supplied to the power-off unit corresponding to each of the determined logic blocks to the second logic state.

With the above-stated construction, because a power-off technique that is a known technique is used for stop control of a logic block, a load for developing the stop control of the logic block can be reduced.

The above-mentioned object can be also achieved by a logic block control system comprising: a programmable logic unit that includes a plurality of logic blocks for performing logic operation processing, and is capable of programmably changing a setting of a connection state between the plurality of logic blocks; a determination unit operable to determine, from among the plurality of logic blocks, logic blocks whose operations are to be stopped, based on an operation time of each of the plurality of logic blocks, a number of the determined logic blocks being equal to a number of logic blocks whose operations are stoppable when the programmable logic unit performs target processing; and a control unit operable to stop the operations of the logic blocks determined by the determination unit, and change the setting of the connection state between the plurality of logic blocks to enable the target processing.

A logic block control method of the present invention is a logic block control method of controlling an operation of each of a plurality of logic blocks for performing logic operation processing included in a programmable logic unit that is capable of programmably changing a setting of a connection state between the plurality of logic blocks, comprising: a determination step of determining, from among the plurality of logic blocks, logic blocks whose operations are to be stopped, based on an operation time of each of the plurality of logic blocks, a number of the determined logic blocks being equal to a number of logic blocks whose operations are stoppable when the programmable logic unit performs target processing; and a control step of stopping the operations of the logic blocks determined by the determination step, and changing the setting of the connection state between the plurality of logic blocks to enable the target processing.

With the above-stated construction of each of the logic block control system and the logic block control method, because a logic block whose operation is to be stopped is determined based on an operation time of each of logic blocks, an operation amount of a logic block can be equalized between the logic blocks. Therefore, a degradation level can be equalized between the logic blocks, and an error in transfer of data between the logic blocks, which is due to clock skew or the like caused by degradation with time of an element in a logic block, can be prevented.

BRIEF DESCRIPTION OF THE DRAWINGS

FIGS. 6A and 6B show a concrete example of the logic block control processing of the first embodiment.

FIGS. 13A and 13B illustrate a situation where an operational defect in a programmable logic circuit is caused by clock skew.

Figure 1:
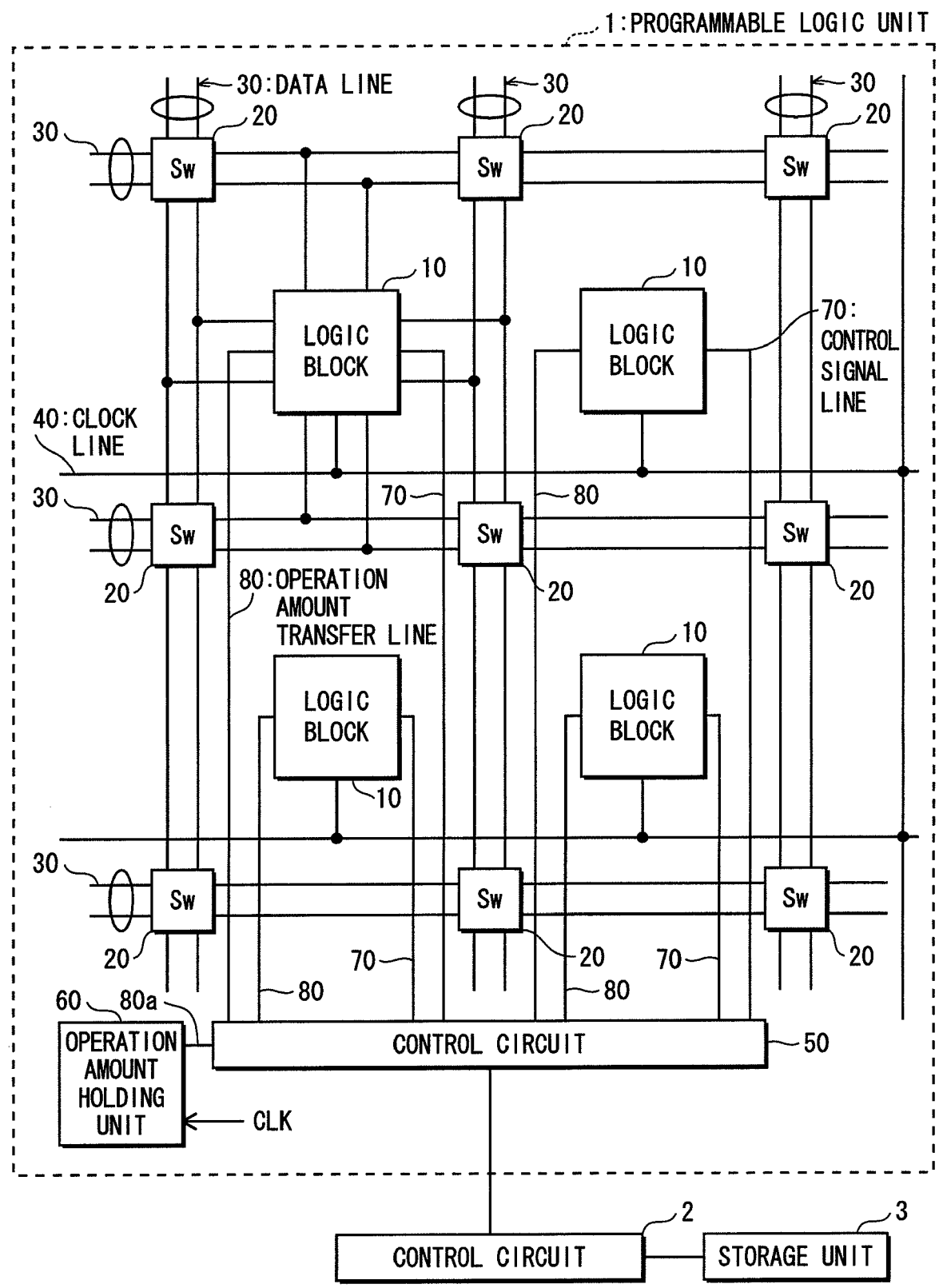
FIG. 1 is a block diagram showing a structure of a programmable logic circuit of a first embodiment.

DESCRIPTION OF REFERENCE NUMERALS 1 programmable logic unit
2 control circuit
2a stoppable block number obtaining unit
2b operation clock number obtaining unit
2c stop rate calculation unit
2d stop block determination unit
3 storage unit
10 logic block
12 clock gate circuit
14 operation amount holding unit
50 control circuit
51 operation clock number transfer unit
52 control signal generation unit
60 operation amount holding unit

BEST MODE FOR CARRYING OUT THE INVENTION

First Embodiment

The following describes a first embodiment of the present invention, with reference to the attached drawings.

<Whole Structure>

The following describes a structure of a programmable logic circuit of the first embodiment, with reference to FIG. 1. FIG. 1 is a block diagram showing the structure of the programmable logic circuit of the first embodiment.

In FIG. 1, a programmable logic unit 1 is controlled by an external control circuit 2. The control circuit 2 writes data to a storage unit 3, and reads data from the storage unit 3.

The programmable logic unit 1 includes a plurality of logic blocks 10 (only four logic blocks are shown in FIG. 1), a data line 30 for connecting the plurality of logic blocks 10 and transferring data between the plurality of logic blocks 10, and line switches 20 for changing the connection of the data line 30 among the plurality of logic blocks 10 based on a program.

The programmable logic unit 1 further includes a control circuit 50. For example, the control circuit 50 performs switching control of the line switches 20 to realize target processing by logic blocks excluding one or more logic blocks whose operations are to be stopped.

The programmable logic unit 1 further includes an operation amount holding unit 60. The operation amount holding unit 60 counts a clock signals CLK that is oscillated by an oscillation circuit (not shown) to hold an operation clock number corresponding to an operation amount of the programmable logic unit 1. The operation amount holding unit 60 is connected to the control circuit 50 with an operation amount transfer line 80a. The operation clock number held by the operation amount holding unit 60 is read by the control circuit 50, and the operation clock number is reset by the control circuit 50.

In the programmable logic unit 1, a control signal line 70 for controlling an operation of each of the plurality of logic blocks 10 is arranged between the control circuit 50 and the logic block 10, and an operation amount transfer line 80 for reading an operation clock number held by each of the plurality of logic blocks 10 is arranged between the control circuit 50 and the logic block 10.

Note that only one logic block 10 is connected to the data line 30 in FIG. 1. However, all of the plurality of logic blocks 10 are connected to the data line 30.

(Storage Content of Storage Unit 3)

Figures 2, 3:
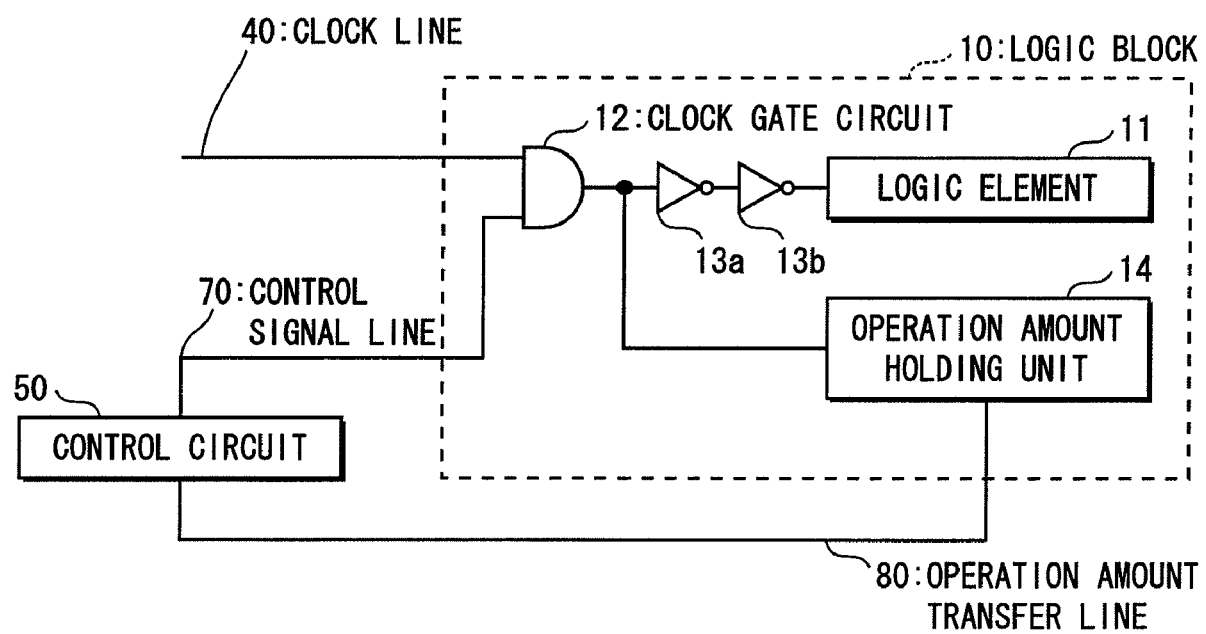
FIG. 2 shows a storage content of a storage unit 3 in FIG. 1.
FIG. 3 is a block diagram showing a structure of a logic block 10 in FIG. 1.

The following describes a storage content of the storage unit 3 in FIG. 1, with reference to FIG. 2. FIG. 2 shows the storage content of the storage unit 3 in FIG. 1.

The storage unit 3 stores an operation clock number corresponding to an operation amount of the whole programmable logic unit 1. In FIG. 2, "whole" in a field "block" indicates the whole programmable logic unit 1.

Also, the storage unit 3 stores an operation clock number corresponding to an operation amount of each of the plurality of logic blocks 10. In FIG. 2, "logic block a", "logic block b", "logic block c", and "logic block d" in the field "block" indicate the plurality of logic blocks 10.

(Structure of Logic Block 10)

The following describes a structure of each of the plurality of logic blocks 10 in FIG. 1, with reference to FIG. 3. FIG. 3 is a block diagram showing the structure of the logic block 10 in FIG. 1.

The logic block 10 performs logic operation processing, and includes a plurality of logic elements 11 (only one logic element is shown in FIG. 3) that operate in synchronism with a clock signal, such as a flip-flop.

The logic block 10 includes a clock gate circuit 12 each of whose input terminals is connected to a clock line 40 and the control signal line 70. When a signal level of the control signal line 70 is HIGH, the clock gate circuit 12 passes a clock signal that is supplied via the clock line 40, and outputs the clock signal from an output terminal. When the signal level of the control signal line 70 is LOW, the clock gate circuit 12 interrupts the clock signal that is supplied via the clock line 40, and outputs a LOW signal from the output terminal. In this manner, since the clock gate circuit 12 interrupts a clock signal, an operation of a logic element 11 and the like which is located next to the clock gate circuit 12 is stopped.

The output from the clock gate circuit 12 is inputted to a control terminal of the logic element 11 via two inverter circuits 13a and 13b. The inverter circuits 13a and 13b are CMOS-type inverters including a PMOS transistor and a NMOS transistor, for example. Note that the number of the inverter circuits 13a and 13b between the clock gate circuit 12 and the logic element 11 is not limited to two.

An operation amount holding unit 14 counts an output from the clock gate circuit 12 to hold the operation clock number of the logic block 10. The clock gate circuit 12 outputs the clock signal when the signal of the control signal line 70 is HIGH, and does not output the clock signal when the signal of the control signal line 70 is LOW. Therefore, the operation amount holding unit 14 counts a clock number during a period in which the logic block 10 is operating.

The operation amount holding unit 14 is connected to the operation amount transfer line 80. The operation clock number held by the operation amount holding unit 14 is read by the control circuit 50, and the operation clock number is reset by the control circuit 50.

(Structures of Control Circuit 2 and Control Circuit 50)

Figure 4:
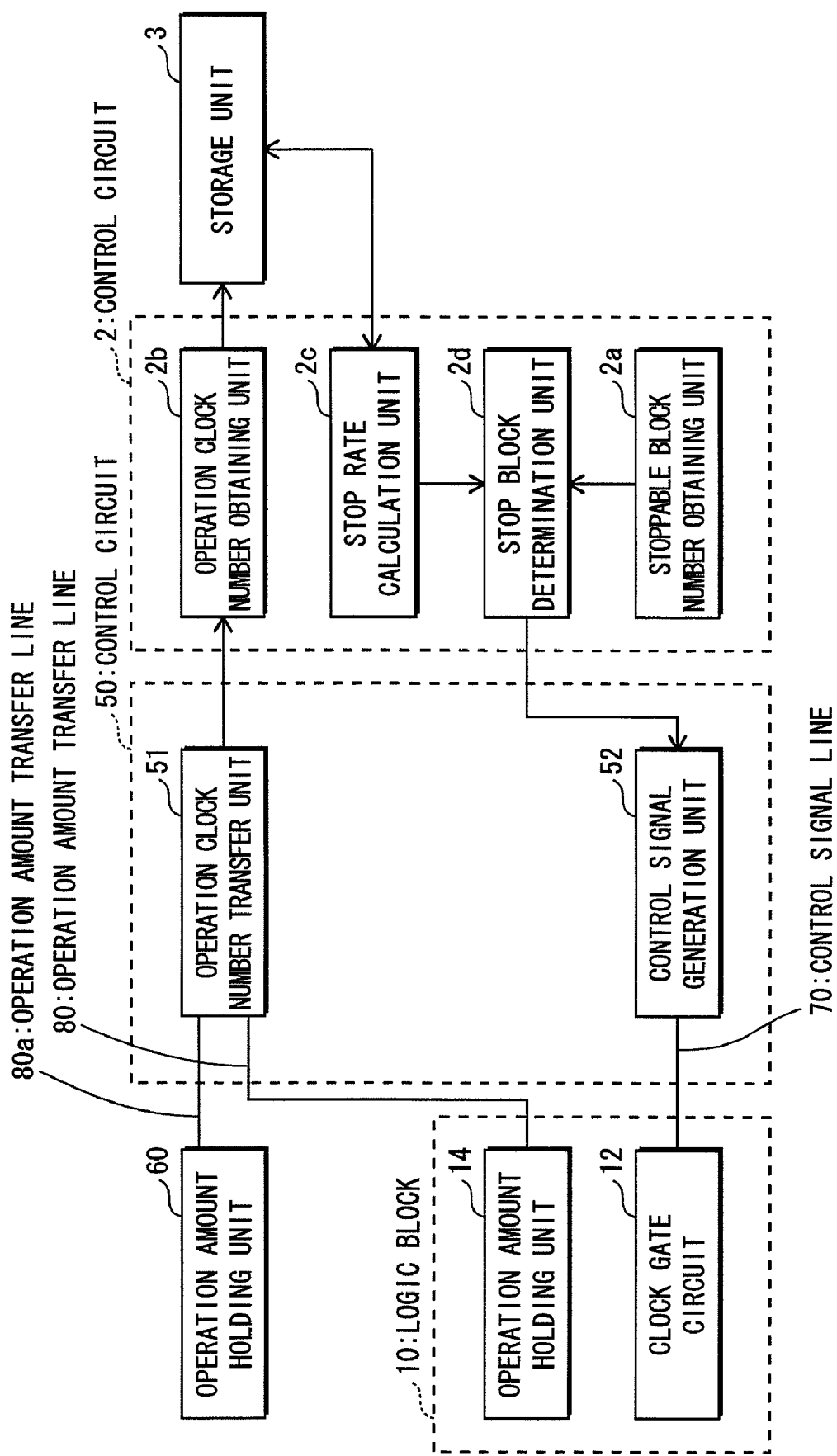
FIG. 4 is a block diagram showing structures of a control circuit 2 and a control circuit 50 in FIG. 1.

The following describes structures of the control circuit 2 and the control circuit 50 in FIG. 1, with reference to FIG. 4. FIG. 4 is a block diagram showing the structures of the control circuit 2 and the control circuit 50 in FIG. 1.

<Structure of Control Circuit 50>

The control circuit 50 includes an operation clock number transfer unit 51 and a control signal generation unit 52.

The operation clock number transfer unit 51 reads the operation clock number held by the operation amount holding unit 60 via the operation amount transfer line 80a, in a predetermined cycle and at a timing of switching a logic structure (hereinafter, referred to as structure) of the programmable logic unit 1, and outputs the read operation clock number to an operation clock number obtaining unit 2b in the control circuit 2, which will be described later. After reading the operation clock number held by the operation amount holding unit 60, the operation clock number transfer unit 51 resets the operation clock number held by the operation amount holding unit 60.

Also, the operation clock number transfer unit 51 reads, for each of the plurality of logic blocks 10, the operation clock number held by the operation amount holding unit 14 via the operation amount transfer line 80, in a predetermined cycle and at a timing of switching the structure of the programmable logic unit 1, and outputs the read operation clock number to the operation clock number obtaining unit 2b. After reading the operation clock number held by the operation amount holding unit 14, the operation clock number transfer unit 51 resets the operation clock number held by the operation amount holding unit 14.

The control signal generation unit 52 sets a signal of a control signal line 70 which corresponds to each logic block 10 whose operation is determined to stop by a stop block determination unit 2d (which will be described later) in the control circuit 2, to LOW. As a result, the clock gate circuit 12 interrupts a supplied clock signal, and an output from the clock gate circuit 12 is held LOW.

Also, the control signal generation unit 52 sets a signal of a control signal line 70 which corresponds to each logic block 10 other than the logic blocks 10 whose operations are determined to stop by the stop block determination unit 2d, to HIGH. As a result, the clock gate circuit 12 passes a supplied clock signal, and the clock signal is outputted from the clock gate circuit 12.

<Structure of Control Circuit 2>

The control circuit 2 includes a stoppable block number obtaining unit 2a, the operation clock number obtaining unit 2b, a stop rate calculation unit 2c, and the stop block determination unit 2d.

The stoppable block number obtaining unit 2a obtains the number of logic blocks 10 whose operations can be stopped when the programmable logic unit 1 performs target processing (hereinafter, referred to as stoppable block number).

The operation clock number obtaining unit 2b adds the operation clock number corresponding to an operation amount, which is inputted from the operation clock number transfer unit 51, to an operation clock number of a corresponding block (such as "whole", "logic block a", and the like) stored in the storage unit 3. In order that the operation clock number inputted from the operation clock number transfer unit 51 can be added to the operation clock number of the corresponding block, the operation clock number transfer unit 51 outputs information, which indicates that the operation clock number is held by which one of the operation amount holding unit 14 and the operation amount holding unit 60, to the operation clock number obtaining unit 2b, for example.

The stop rate calculation unit 2c calculates an operation time Tall of the whole programmable logic unit 1, by multiplying the operation clock number corresponding to "whole" in the field "block" stored in the storage unit 3 by a time T for one cycle of a clock signal.

The stop rate calculation unit 2c calculates an operation time Trun of a logic block 10, by multiplying the operation clock number corresponding to the logic block 10 in the field "block" stored in the storage unit 3 by the time T.

Then, the stop rate calculation unit 2c calculates a stop time Tstop of the logic block 10, by subtracting the operation time Trun of the logic block 10 from the calculated operation time Tall.

Moreover, the stop rate calculation unit 2c calculates a stop rate of the logic block 10, by dividing the calculated stop time Tstop of the logic block 10 by the calculated operation time Tall.

The stop rate calculation unit 2c performs the above processing on each of the plurality of logic blocks 10 to calculate a stop rate of each logic block 10.

The stop block determination unit 2d selects the same number of logic blocks 10 as the stoppable block number from among the plurality of logic blocks 10, in ascending order of the stop rate calculated by the stop rate calculation unit 2c. Then, the stop block determination unit 2d determines the selected logic blocks 10 as logic blocks whose operations are to be stopped (hereinafter, referred to as stop block), and outputs information indicating the stop blocks to the control signal generation unit 52 in the control circuit 50.

<Operation>

Figure 5:
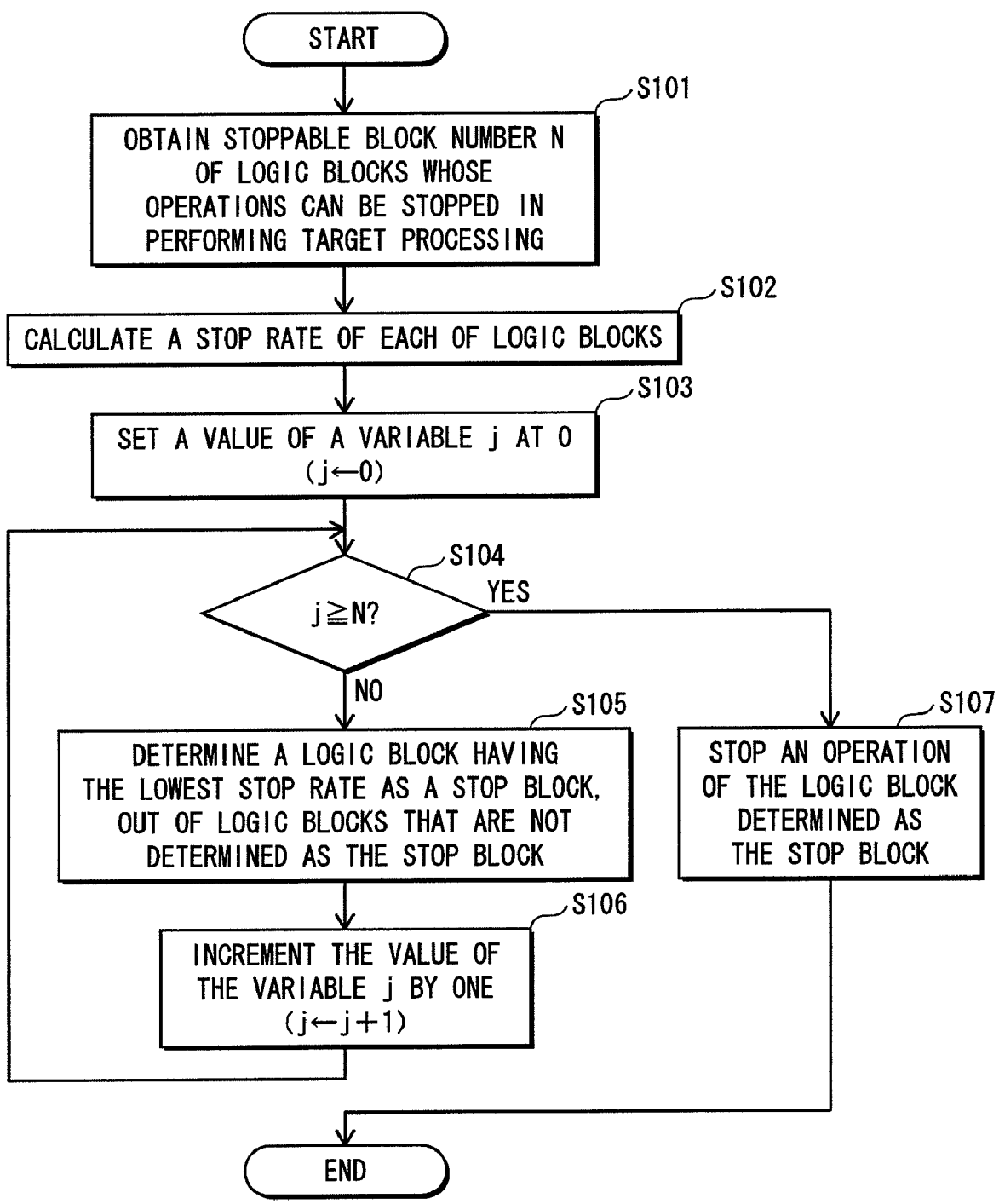
FIG. 5 is a flowchart of logic block control processing of the first embodiment.

The following describes an operation of the programmable logic circuit whose structure has been described with reference to FIGS. 1 to 4, with reference to FIG. 5. FIG. 5 is a flowchart of logic block control processing performed by the programmable logic circuit in FIG. 1.

When a structure of the programmable logic circuit is switched to a different structure, the stoppable block number obtaining unit 2a obtains a stoppable block number N of logic blocks 10 whose operations can be stopped when the programmable logic unit 1 performs target processing, relating to the different structure to be performed (step S101).

Then, the operation clock number obtaining unit 2b updates a content of the storage unit 3 based on the operation clock number inputted from the operation clock number transfer unit 51, and the stop rate calculation unit 2c calculates a stop rate of each of the logic blocks 10 (step S102).

The stop block determination unit 2d sets a value of a variable j at 0 (step S103).

The stop block determination unit 2d judges whether the value of the variable j is equal to or larger than the stoppable block number N (step S104).

When the value of the variable j is not equal to or larger than the stoppable block number N ("NO" in step S104), the stop block determination unit 2d determines a logic block having a lowest stop rate as a stop block, excluding one or more logic blocks that have been determined as stop blocks (step S105).

The stop block determination unit 2d increments the value of the variable j by one (step S106), and the processing in step S104 is performed.

When the value of the variable j is equal to or larger than the stoppable block number N ("YES" in step S104), the control signal generation unit 52 stops an operation of the stop block by setting a signal of a control signal line 70, which corresponds to each logic block 10 that has been determined as a stop block, to LOW. Also, the control signal generation unit 52 sets a signal of a control signal line 70, which corresponds to each logic block 10 (hereinafter, referred to as operation block) excluding the logic blocks 10 that have been determined as the stop blocks, to HIGH. The control unit 50 sets a connection state between the logic blocks based on the operation blocks and the stop blocks so that target processing can be performed by the operation blocks (step S107).

<Concrete Example>

The following describes a concrete example of the operation of the programmable logic circuit that has been described with reference to FIGS. 1 to 5, with reference to FIG. 6. FIG. 6 shows the concrete example of the logic block control processing performed by the programmable logic circuit in FIG. 1.

In this concrete example, the programmable logic unit 1 includes four logic blocks 10a to 10d, and repeats a structure (structure A) in which the number of logic blocks that are required to operate when the programmable logic unit performs target processing is four, and structures (structures B, C, D, and E) in which the number of logic blocks that are required to operate when the programmable logic unit 1 performs target processing is one. Note that operation times of the structures B, C, D, and E are same.

From a time T0 to a time T1, the control unit 2 determines all of the logic blocks 10a to 10d as operation blocks that are to be operated (structure A).

From the time T1 to a time T2, the control unit 2 determines the logic blocks 10b to 10d as stop blocks, and determines the logic block 10a as an operation block because stop rates of the logic blocks 10a to 10d are same (structure B).

From the time T2 to a time T3, the control unit 2 determines all of the logic blocks 10a to 10d as the operation blocks (structure A).

From the time T3 to a time T4, the control unit 2 determines the logic block 10a as a stop block because a stop rate of the logic block 10a is lowest. Also, the control unit 2 determines the logic blocks 10b and 10d as stop blocks, and determines the logic block 10c as an operation block because stop rates of the logic blocks 10b to 10d are same (structure C).

From the time T4 to a time T5, the control unit 2 determines all of the logic blocks 10a to 10d as the operation blocks (structure A).

From the time T5 to a time T6, the control unit 2 determines the logic blocks 10a and 10c as stop blocks because stop rates of the logic blocks 10a and 10c are lowest. Also, the control unit 2 determines the logic block 10b as a stop block and determines the logic block 10d as an operation block because stop rates of the logic blocks 10b and 10d are same (structure D).

From the time T6 to a time T7, the control unit 2 determines all of the logic blocks 10a to 10d as the operation blocks (structure A).

From the time T7 to a time T8, the control unit 2 determines the logic blocks 10a, 10c, and 10d as stop blocks and determines the logic block 10b as an operation block because stop rates of the logic blocks 10a, 10c, and 10d are lowest (structure E).

In this concrete example, when an operation time of the structure A is TA and an operation time of the structures B, C, D, and E is TB, a difference of the stop rates between the logic blocks is TB/(TA+TB) at a maximum, and the difference cannot be larger than TB/(TA+TB).

The maximum clock skew due to degradation with time of the logic block between the logic blocks is clock skew between the logic block 10a and the other logic blocks after the processing of the structure B has been performed. Therefore, a skew margin, which can deal with the clock skew between the logic block 10a and the other logic blocks after the processing of the structure B has been performed, may be provided between the logic blocks.

As a method of providing a skew margin, skew margins that can deal with the maximum clock skew may be provided between all of the logic blocks, during a whole period until the stop rates of all of the logic blocks become same. Also, by calculating a clock delay variation amount in each of the structures, a skew margin based on the calculated clock delay variation amount may be provided between necessary logic blocks.

<Effect>

According to the first embodiment, a stop block is determined based on a stop rate relating to a stop time of each of the logic blocks, in ascending order of the stop rate. Therefore, an operation amount of each of the logic blocks 10 can be equalized between the logic blocks. As a result, a length of clock skew between the logic blocks can be suppressed, and an error in transfer of data between the logic blocks due to the clock skew caused by degradation with time of a logic block can be prevented.

Also, since a programmable logic circuit can be designed based on shorter clock skew, the number of delay elements inserted between the logic blocks can be reduced. With this construction, power consumption in a programmable logic unit and the like can be reduced, line congestion can be relieved, and an increase of an area of the programmable logic circuit can be suppressed.

Second Embodiment

The following describes a second embodiment of the present invention, with reference to the attached drawings.

Although the gated clock technique of stopping a clock supply to a logic element and the like is used to stop an operation of a logic block in the first embodiment, the power-off technique of interrupting a logic element and the like from a power supply is used to stop an operation of a logic block in the second embodiment.

In the second embodiment, a structure of each of logic blocks included in the programmable logic unit 1 and a level of each control signal line 70 of stopping an operation of a logic block are different from the first embodiment, and other structures are substantially same as the first embodiment.

Note that in the second embodiment, the same symbols as in the first embodiment are assigned to component parts having the substantially same functions, and the explanations thereof are omitted.

<Structure>

(Structures of Control Circuit 50a and Logic Block 200)

Figure 7:
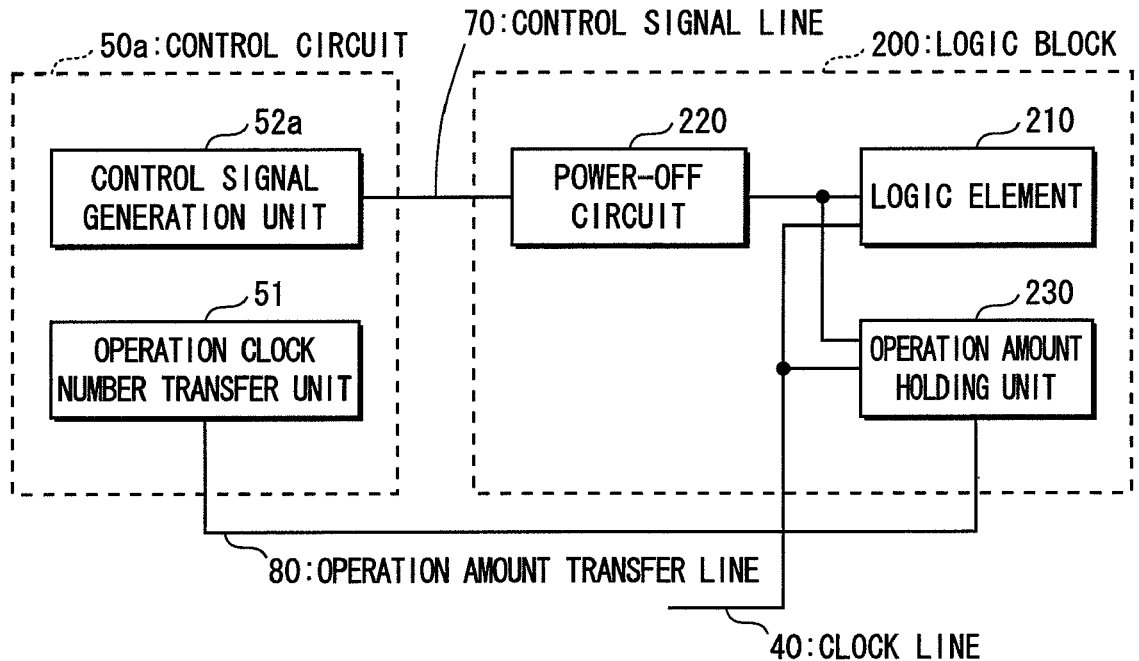
FIG. 7 is a block diagram showing structures of a control circuit 50a and a logic block 200 of a second embodiment.

The following describes structures of a control circuit 50a and a logic block 200 of the second embodiment, with reference to FIG. 7. FIG. 7 is a block diagram showing the structures of the control circuit 50a and the logic block 200 of the second embodiment.

<Structure of Control Circuit 50a>

The control circuit 50a includes the operation clock number transfer unit 51 and a control signal generation unit 52a.

The control signal generation unit 52a sets a signal of a control signal line 70 corresponding to each logic block 10 that is determined as a stop block by the stop block determination unit 2d in the control circuit 2, to HIGH, and sets a signal of a control signal line 70 corresponding to each logic block 10 other than the determined stop blocks, to LOW.

<Logic Block 200>

The logic block 200 performs logic operation processing, and includes a plurality of logic elements 210 (only one logic element is shown in FIG. 7) that operate in synchronism with a clock signal, such as a flip-flop.

A power-off circuit 220 electrically connects a logic element 210 and an operation amount holding unit 230 to a power supply when a signal of the control signal line 70 is LOW, and electrically interrupts the logic element 210 and the operation amount holding unit 230 from the power supply when a signal of the control signal line 70 is HIGH.

The operation amount holding unit 230 counts a clock signal that is oscillated by an oscillation circuit (not shown) and holds an operation clock number corresponding to an operation amount of the logic block 200, while the operation amount holding unit 230 is electrically connected to the power supply, i.e. while the logic block 200 is operating.

The operation amount holding unit 230 is connected to the operation amount transfer line 80. The operation clock number held by the operation amount holding unit 230 is read by the operation clock number transfer unit 51, and the operation clock number is reset by the operation clock number transfer unit 51.

(Structure of Power-off Circuit)

Figure 8:
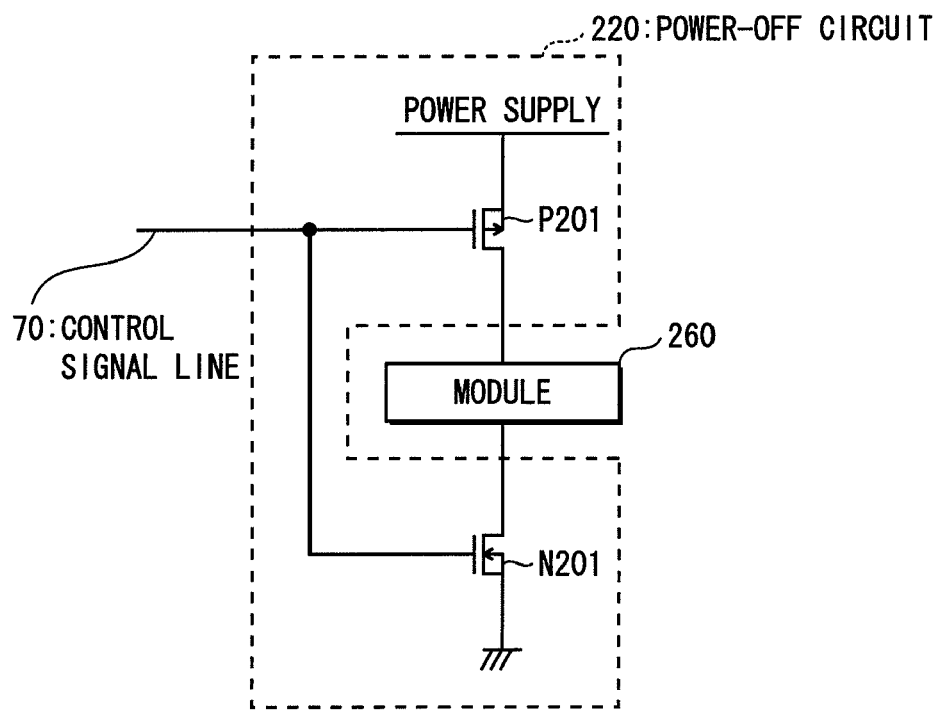
FIG. 8 is a block diagram showing a structure of a power-off circuit 220 in FIG. 7.

The following describes a structure of the power-off circuit 220 in FIG. 7, with reference to FIG. 8. FIG. 8 is a block diagram showing the structure of the power-off circuit 220 in FIG. 7.

A module 260 is such as the logic element 210, the operation amount holding unit 230, and the like in FIG. 7. Note that the present invention may have a construction in which the module 260 does not include the operation amount holding unit 230.

The power-off circuit 220 includes a PMOS transistor P201 whose source is connected to a power supply and drain is connected to the module 260, and a NMOS transistor N201 whose drain is connected to the module 260 and source is connected to a ground plate.

Each of gates of the PMOS transistor P201 and the NMOS transistor N201 is connected to the control signal line 70.

When a signal of the control signal line 70 is LOW, the module 260 is electrically connected to the power supply, and a power is supplied to the module 260 to cause the module 260 to perform an operation. When a signal of the control signal line 70 is HIGH, the module 260 is electrically interrupted from the power supply, and a power is not supplied to the module 260 to cause the module 260 to stop the operation.

Third Embodiment

The following describes a third embodiment of the present invention, with reference to the attached drawings.

Although the processing of determining a stop block based on a stop rate of each of the logic blocks 10 is always performed regardless of an operation time of the programmable logic unit 1 in the first embodiment, the processing of determining a stop block based on a stop rate of each of the logic blocks 10 is performed only when an operation time of the programmable logic unit 1 is in a predetermined range in the third embodiment.

Also, in the third embodiment, a stop rate, which is different from the stop rate of the first embodiment, is used. The stop rate used in the third embodiment will be described later.

In the third embodiment, a structure of a control circuit provided in an outside of the programmable logic unit 1 is different from the first embodiment, and other structures are substantially same as the first embodiment.

Note that in the third embodiment, the same symbols as in the first embodiment are assigned to component parts having the substantially same functions, and the explanations thereof are omitted.

<Outline of Degradation with Time of Transistor>

Figure 9:
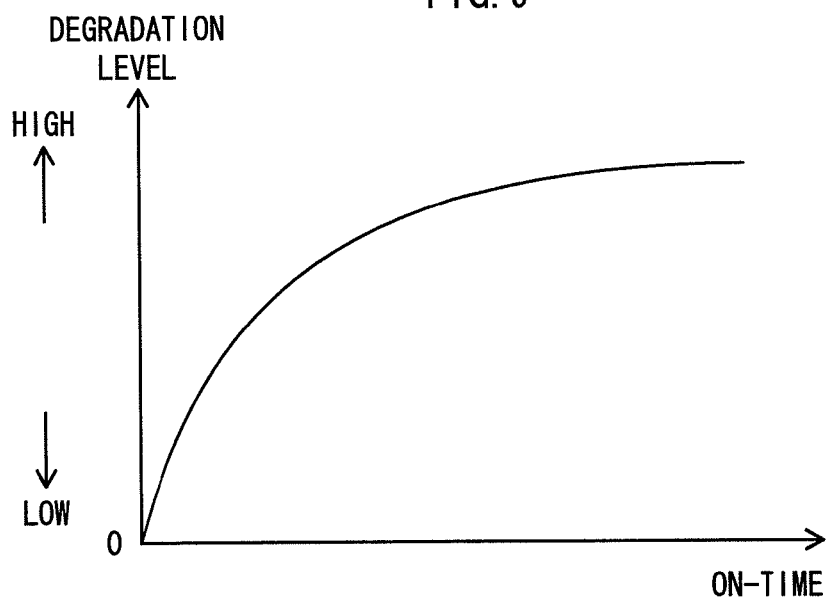
FIG. 9 shows an outline of degradation with time of a P-channel MOS transistor.

The following describes an outline of degradation with time of a PMOS transistor, with reference to FIG. 9. FIG. 9 shows the outline of the degradation with time of the PMOS transistor.

When an ON-time is short, a PMOS transistor is sharply degraded as the ON-time increases, and when the ON-time is long, the degradation is not progressed so much as the ON-time increases. Note that as mentioned above, degradation of a PMOS transistor causes a rise of a threshold voltage of the PMOS transistor, and the rise of the threshold voltage of the PMOS transistor causes an increase of a delay amount of an output to an input in a logic element including the PMOS transistor.

Therefore, in view of degradation with time of a logic element, and degradation with time of an inverter circuit and the like that are arranged between a clock gate circuit and the logic element, a function F, which uses a time as a variable and indicates a delay variation amount of the logic block, is prepared for each logic block, and the function F is used for calculation of a stop rate of the logic block. Note that as a stop time of a logic block increases, a delay variation relating to the logic block increases.

There is a possibility that delay variations of logic blocks are different even if the logic blocks have same stop times, according to a structure of a logic block such as the number of stages of inverter circuits between a clock gate circuit and a logic element. Therefore, if a stop rate is obtained by dividing a stop time by a whole operation time and a stop block is determined based on the obtained stop rate, an actual delay variation of a logic block may not be reflected.

Compared with this, if the function F indicating a delay variation is prepared and a stop block is determined using the function F, there is an advantage that an actual delay variation of a logic block is reflected.

<Structure>

(Structure of Control Circuit 300)

A control circuit 300 includes the stoppable block number obtaining unit 2a, the operation clock number obtaining unit 2b, a threshold value comparison unit 301, a stop rate calculation unit 302, and a stop block determination unit 303.

The threshold value comparison unit 301 compares a whole operation amount, which is obtained by multiplying the operation clock number corresponding to "whole" in the field "block" stored in the storage unit 3 by a cycle of a clock signal, with a first threshold value, and compares the whole operation amount with a second threshold value.

The following describes the first threshold value and the second threshold value.

For example, the following operation amount is defined as the first threshold value. The operation amount is equal to or larger than the maximum operation amount of a programmable logic circuit, which is presumed to be possible to cause an error due to a difference of degradation levels between logic blocks in transfer of data between the logic blocks, when a part of the logic blocks are stopped.

Also, the following operation amount is defined as the second threshold value. The operation amount is equal to or larger than the minimum operation amount of a programmable logic circuit, which is presumed to be impossible to cause an error due to a difference of degradation levels between logic blocks in transfer of data between the logic blocks, even if a stop block is randomly determined without performing the processing of determining a stop block based on a stop time.

Note that the first threshold value is smaller than the second threshold value.

The stop rate calculation unit 302 performs substantially the same processing as the stop rate calculation unit 2c to calculate an operation time Tall of the whole programmable logic unit 1 and a stop time Tstop of a logic block 10.

The stop rate calculation unit 302 calculates F (Tall) and F (Tstop) of the logic block 10, and calculates a stop rate of the logic block 10 by dividing F (Tstop) by F (Tall).

The stop rate calculation unit 302 performs the above processing on each of the logic blocks 10 to calculate a stop rate of each logic block.

When a whole operation amount is smaller than the first threshold value as a result of the comparison by the threshold value comparison unit 301, the stop block determination unit 303 determines that there is no stop block and determines all of the logic blocks 10 as operation blocks.

When a whole operation amount is equal to or larger than the first threshold value, and smaller than the second threshold value as a result of the comparison by the threshold value comparison unit 301, the stop block determination unit 303 performs the same processing as the stop block determination unit 2d to determine a stop block.

When a whole operation amount is equal to or larger than the second threshold value as a result of the comparison by the threshold value comparison unit 301, the stop block determination unit 303 randomly determines, as stop blocks, the same number of logic blocks 10 as the stoppable blocks number, from among the plurality of logic blocks 10 included in the programmable logic unit 1.

By randomly determining stop blocks from among a plurality of logic blocks when a whole operation amount is equal to or larger than the second threshold value, a load of the processing of determining a stop block can be reduced, and a size of the operation amount holding unit can be reduced.

<Operation>

Figure 10:
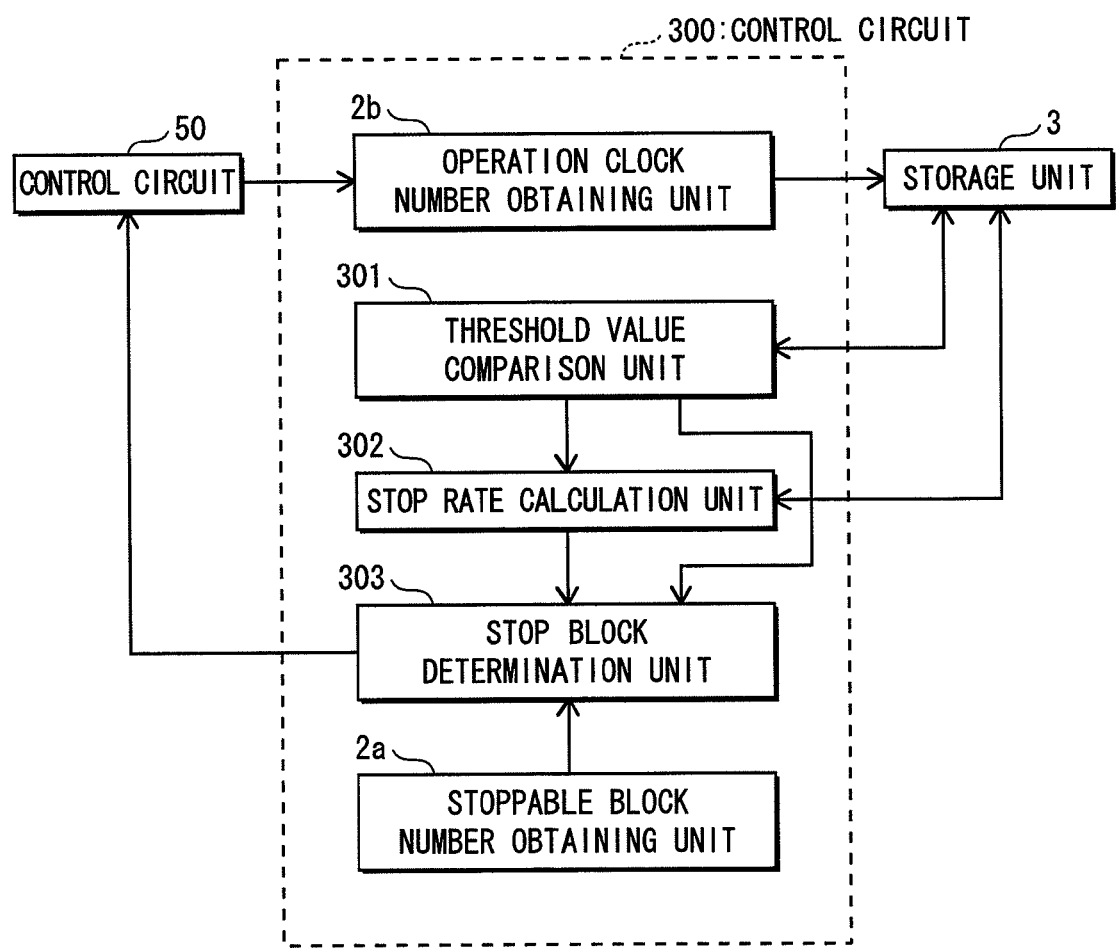
FIG. 10 is a block diagram showing a structure of a control circuit 300 of a third embodiment.
Figure 11:
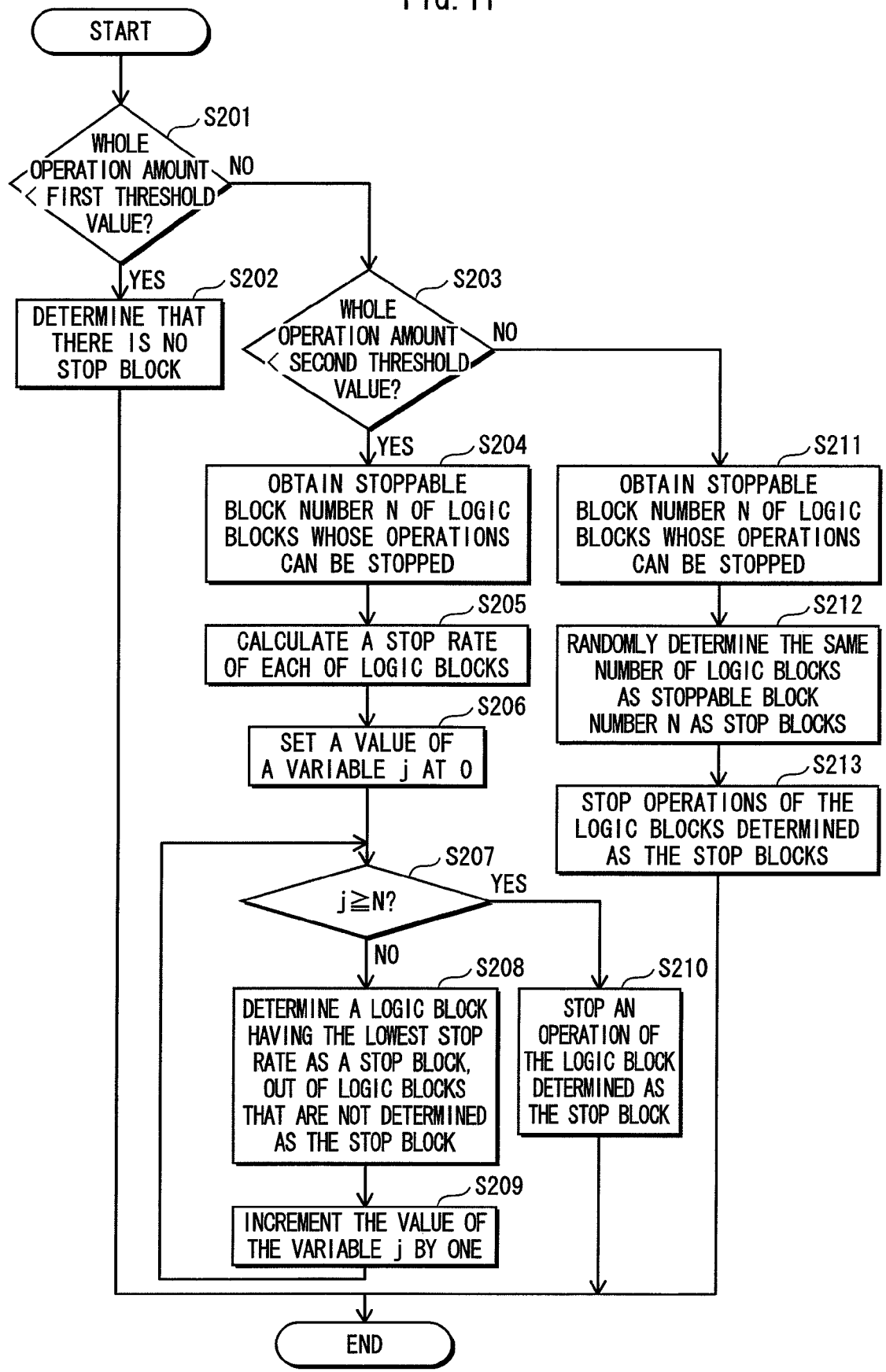
FIG. 11 is a flowchart of logic block control processing of the third embodiment.
Figure 12:
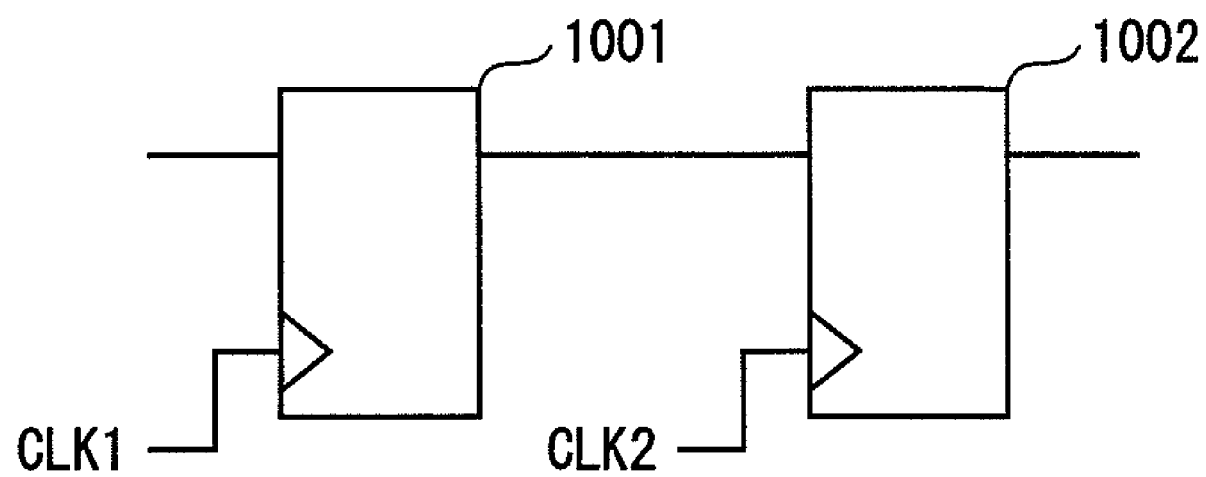
FIG. 12 illustrates a situation where an operational defect in a programmable logic circuit is caused by clock skew.
Figure 14:
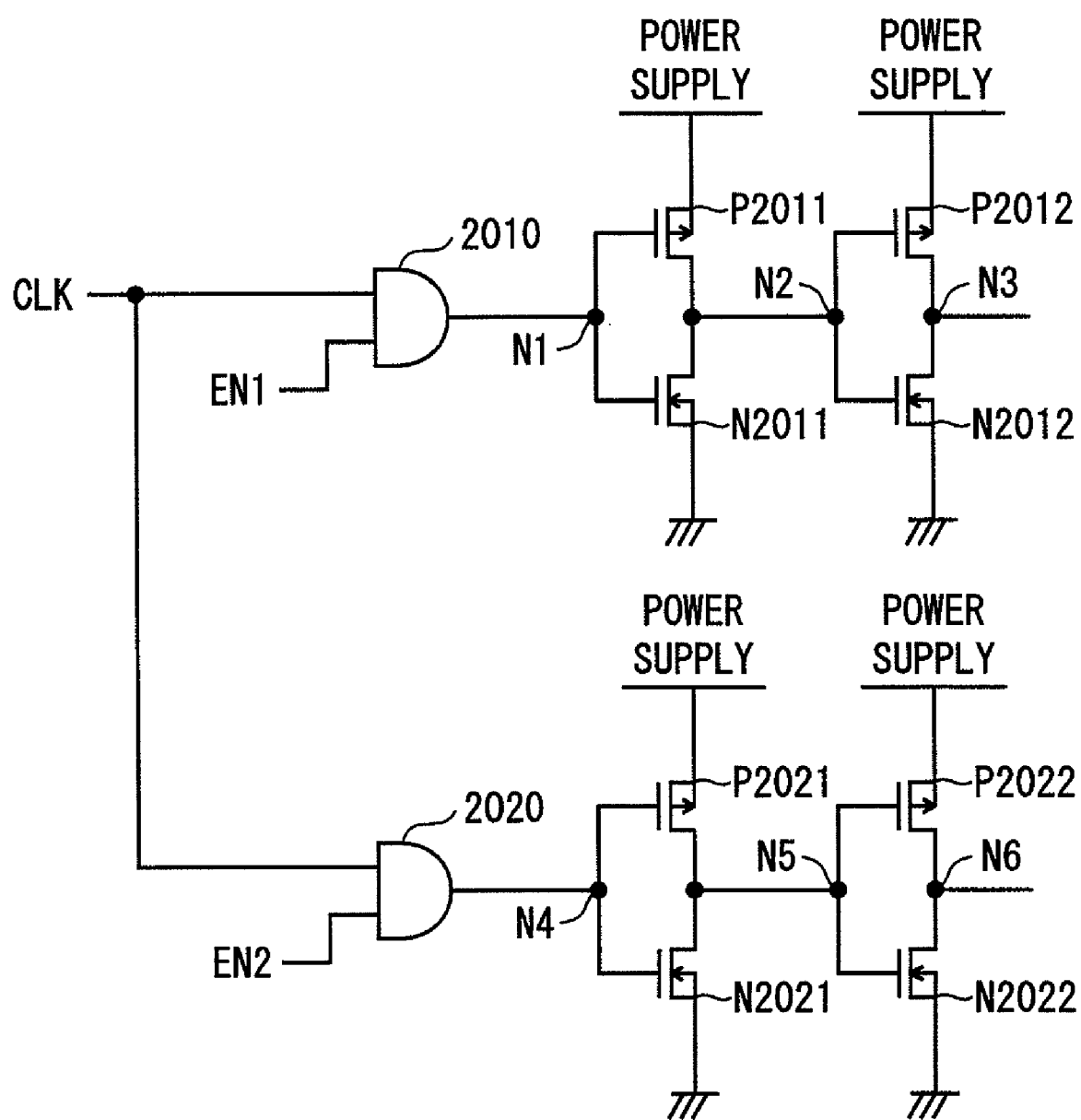
FIG. 14 illustrates a situation where clock skew occurs due to degradation with time of a transistor.
Figure 15:
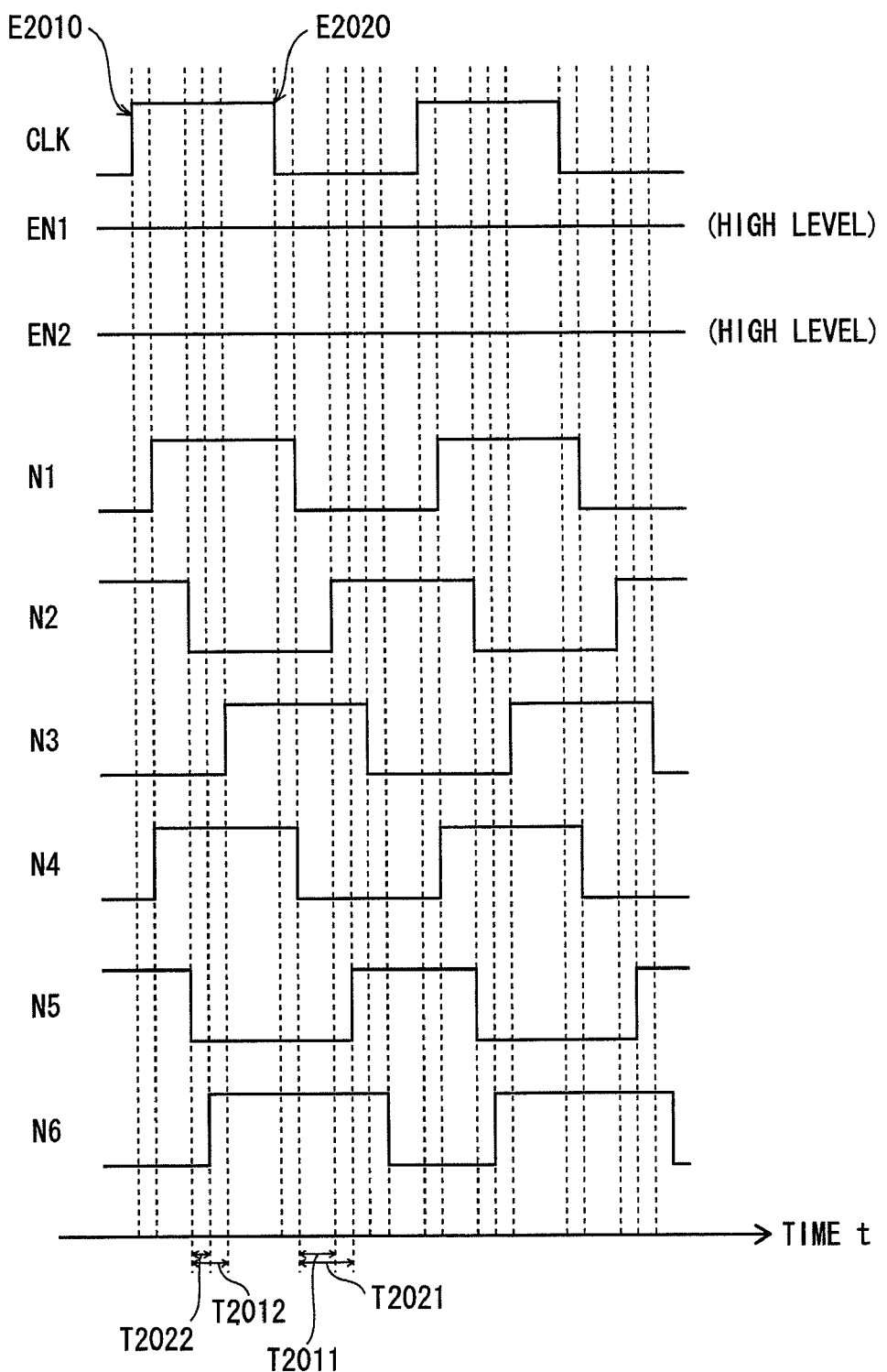
FIG. 15 illustrates a situation where clock skew occurs due to degradation with time of a transistor.

The following describes an operation of the programmable logic circuit that has been described with reference to FIG. 10, with reference to FIG. 11. FIG. 11 is a flowchart of logic block control processing performed by the programmable logic circuit in FIG. 10.

The threshold value comparison unit 301 judges whether a whole operation amount of the programmable logic unit 1 is smaller than the first threshold value (step S201).

When the whole operation amount is smaller than the first threshold value ("Yes" in step S201), the stop block determination unit 303 determines that there is no stop block, and the control unit 50 operates all of the logic blocks (step S202).

When the whole operation amount is not smaller than the first threshold value ("No" in step S201), the threshold value comparison unit 301 judges whether the whole operation amount of the programmable logic unit 1 is smaller than the second threshold value (step S203).

When the whole operation amount is smaller than the second threshold value ("Yes" in step S203), steps S204 to S210 are performed. In the steps S204 to S210, substantially the same processing as the steps S101 to S107 in FIG. 5 are performed, excluding a method of calculating a stop rate of a logic block.

When the whole operation amount is not smaller than the second threshold value ("No" in step S203), the stoppable block number obtaining unit 2a obtains the stoppable blocks number N of logic blocks 10 whose operations can be stopped when performing target processing (step S211).

The stop block determination unit 303 randomly selects the same number of logic blocks as the stoppable blocks number N, as logic blocks whose operations are to be stopped, from among a plurality of logic blocks included in the programmable logic unit 1, and determines the selected logic blocks as stop blocks (step S212).

The control unit 50 stops operations of the stop blocks determined in the step S212 (step S213).

Supplement

Note that the present invention is not limited to the above-mentioned embodiments, and is practicable in any embodiment to achieve the object of the present invention and an object that relates to or accompanies the object of the present invention. For example, the following are modifications.

(1) In the above-mentioned embodiments, a logic block whose operation is to be stopped is determined based on a stop time of each of logic blocks. However, a logic block whose operation is to be stopped may be determined based on an operation time of each of logic blocks.

For example, for each of logic blocks, an operation time Trun of the logic block is divided by an operation time Tall of the whole programmable logic unit to calculate an operation rate of the logic block. Then, from among the plurality of logic blocks included in the programmable logic unit, the same number of logic blocks as the stoppable logic block number may be determined as stop blocks in descending order of the operation rate.

(2) As in the case of the third embodiment, in the first and second embodiments, only when an operation amount of the programmable logic unit 1 is equal to or larger than the first threshold value, and smaller than the second threshold value, the processing of determining a stop block using a stop rate based on a stop time may be performed.

(3) In the above-mentioned embodiments, a stop block is determined using a stop rate of each of logic blocks. However, a stop time itself of each of logic blocks, or the number of stops of each of logic blocks may be used.

(4) For example, the following function may be added to the above-mentioned embodiments. While a programmable logic circuit is operating, a stop rate of each of logic blocks is calculated, and it is judged whether stop rates of stop blocks are in a predetermined range for stop rates of all of operation blocks. Then, a stop block whose stop rate is not in the predetermined range for a stop rate of any of the operation blocks is detected, and the detected stop block is forcibly operated. Here, the predetermined range is a design item that is determined based on a difference of stop rates between logic blocks, which is presumed that transfer of data between the logic blocks may not be performed due to a difference of degradation levels between the logic blocks. For example, the predetermined range is equal to or larger than 90% of a stop rate of a logic block that is operating.

(5) In the above-mentioned embodiments, the number of clocks of a clock signal oscillated by an oscillation circuit (not shown) is counted in order to measure a whole operation amount of a programmable logic unit and an operation amount of each of logic blocks. However, the clock signal oscillated by the oscillation circuit (not shown) may be frequency-divided by a frequency dividing circuit, and the frequency-divided clock signal may be counted.

(6) In the above-mentioned embodiments, an operation state of each of logic blocks included in the programmable logic unit 1, such as a stop of a logic block, is individually controlled. However, the present invention may have a construction in which a plurality of logic blocks are divided into a plurality of groups, and operation states such as stops of the logic blocks are controlled in units of group. In this case, a line resource or a logic resource required for the control of an operation state such as a stop of a logic block can be saved.

(7) In the above-mentioned embodiments, a control mechanism for performing stop control of a logic block is realized by control circuits each provided in an outside and an inside of the programmable logic unit 1. However, the control mechanism may be realized by a control circuit provided only in the outside, or by a control circuit provided only in the inside. Moreover, a control circuit having apart of a function of the above control mechanism may be provided in a logic block.

(8) In the above-mentioned embodiments, a control circuit is provided separately from logic blocks. However, any of the logic blocks may be used as the control circuit. In this case, if a logic block having logic granularity suitable for control is used as the control circuit, a size of the programmable logic circuit can be reduced, and low power consumption of the programmable logic circuit can be realized.

(9) A register indicating a stop state of each of logic blocks may be provided in the above-mentioned embodiments. In this case, by using a value of the register, a control suitable for an operation state of each of the logic blocks can be performed, even if a structure is added and changed after an operation starts.

(10) In the above-mentioned embodiments, the processing of selecting a stop block is performed when a structure is switched to a different structure while operating. However, the processing of selecting a stop block may be performed in advance using a structure of performing the processing and an execution time of the structure.

(11) In the above-mentioned embodiments, a clock gate circuit and a power-off circuit are provided in an inside of a logic block. However, the clock gate circuit and the power-off circuit may be provided in an outside of each of all logic blocks, or the clock gate circuit and the power-off circuit may be provided in outsides of only a part of the logic blocks.

(12) In the second embodiment, an operation state of a logic block is controlled by electrically connecting a power supply to a module, or electrically disconnecting the power supply to the module. However, the operation state of the logic block may be controlled by switching levels of a power supply voltage.

(13) In the second embodiment, a switching unit (PMOS transistor P201) for electrically connecting a power supply to the module 260 or interrupting the power supply from the module 260, and a switching unit (NMOS transistor N201) for electrically connecting the module 260 to a ground plate or interrupting the module 260 from the ground plate are provided. However, only the switching unit for electrically connecting the power supply to the module 260 or interrupting the power supply from the module 260 may be provided, or only the switching unit for electrically connecting the module 260 to the ground plate or interrupting the module 260 from the ground plate may be provided.

(14) If the programmable logic circuit in the above-mentioned embodiments is applied to a mobile phone, the processing of determining a logic block whose operation is to be stopped may be performed at a timing at which a beacon signal transmitted from a wireless base station is intermittently received.

(15) In the above-mentioned embodiments, the operation amount holding unit counts the clock signal to hold the operation clock number of the whole programmable logic unit and the operation clock number of a logic block. However, the present invention may have a construction in which the operation amount holding unit is composed of a nonvolatile memory and the like, a dedicated counter circuit for counting the clock signal is provided, and a control circuit increments a value of the operation amount holding unit corresponding to each of the operating logic block and the programmable logic unit by one in accordance with an output of the counter circuit.

In the above-mentioned embodiments, the storage unit 3 may be composed of a nonvolatile memory, a HDD (Hard Disk Drive), or the like.

INDUSTRIAL APPLICABILITY

The present invention can be used for operation control of logic blocks included in a programmable logic circuit.

The invention claimed is:
1. A logic block control system comprising:
a programmable logic unit that includes a plurality of logic blocks for performing logic operation processing, and is capable of programmably changing a setting of a connection state between the plurality of logic blocks;
a determination unit operable to determine, from among the plurality of logic blocks, logic blocks whose operations are to be stopped, based on a stop time of each of the plurality of logic blocks, a number of the determined logic blocks being equal to a number of logic blocks whose operations are stoppable when the programmable logic unit performs target processing; and
a control unit operable to stop the operations of the logic blocks determined by the determination unit, and change the setting of the connection state between the plurality of logic blocks to enable the target processing.

2. The logic block control system of claim 1, wherein
the determination unit determines all of the plurality of logic blocks as logic blocks to operate without determining the logic blocks whose operations are to be stopped, until an operation time, in which the programmable logic unit is performing processing, exceeds a predetermined start time, and starts determining the logic blocks whose operations are to be stopped when the operation time exceeds the predetermined start time.

3. The logic block control system of claim 1, further comprising:
a detection unit operable to detect, from among the logic blocks whose operations are stopped by the control unit, a logic block whose value based on a stop time thereof is out of at least a predetermined range for a value based on a stop time of each of all logic blocks which are operating, wherein
the control unit has the logic block detected by the detection unit operate.

4. The logic block control system of claim 1, further comprising:
a clock gate unit operable to, for each of the plurality of logic blocks, pass a clock signal when a control signal is in a first logic state, and interrupt the clock signal when the control signal is in a second logic state, wherein
the control unit stops the operations of the logic blocks determined by the determination unit, by setting the control signal supplied to the clock gate unit corresponding to each of the determined logic blocks to the second logic state.

5. The logic block control system of claim 1, further comprising:
a power-off unit operable to, for each of the plurality of logic blocks, electrically connect the logic block to a power supply when a control signal is in a first logic state, and electrically interrupt the logic block from the power supply when the control signal is in a second logic state, wherein
the control unit stops the operations of the logic blocks determined by the determination unit, by setting the control signal supplied to the power-off unit corresponding to each of the determined logic blocks to the second logic state.

6. A logic block control system comprising:
a programmable logic unit that includes a plurality of logic blocks for performing logic operation processing, and is capable of programmably changing a setting of a connection state between the plurality of logic blocks;
a determination unit operable to determine, from among the plurality of logic blocks, logic blocks whose operations are to be stopped, based on an operation time of each of the plurality of logic blocks, a number of the determined logic blocks being equal to a number of logic blocks whose operations are stoppable when the programmable logic unit performs target processing; and
a control unit operable to stop the operations of the logic blocks determined by the determination unit, and change the setting of the connection state between the plurality of logic blocks to enable the target processing.

7. A logic block control method of controlling an operation of each of a plurality of logic blocks for performing logic operation processing included in a programmable logic unit that is capable of programmably changing a setting of a connection state between the plurality of logic blocks, comprising:

- a determination step of determining, from among the plurality of logic blocks, logic blocks whose operations are to be stopped, based on a stop time of each of the plurality of logic blocks, a number of the determined logic blocks being equal to a number of logic blocks whose operations are stoppable when the programmable logic unit performs target processing; and
- a control step of stopping the operations of the logic blocks determined by the determination step, and changing the setting of the connection state between the plurality of logic blocks to enable the target processing.

8. A logic block control method of controlling an operation of each of a plurality of logic blocks for performing logic operation processing included in a programmable logic unit that is capable of programmably changing a setting of a connection state between the plurality of logic blocks, comprising:

- a determination step of determining, from among the plurality of logic blocks, logic blocks whose operations are to be stopped, based on an operation time of each of the plurality of logic blocks, a number of the determined logic blocks being equal to a number of logic blocks whose operations are stoppable when the programmable logic unit performs target processing; and
- a control step of stopping the operations of the logic blocks determined by the determination step, and changing the setting of the connection state between the plurality of logic blocks to enable the target processing.

* * * * *